US007932665B2

(12) United States Patent
Garcia

(10) Patent No.: US 7,932,665 B2
(45) Date of Patent: Apr. 26, 2011

(54) DUAL FILAMENT LAMP FOR RAPID TEMPERATURE PROCESSING

(75) Inventor: Ceferino Garcia, Juarez Chihuahua (MX)

(73) Assignee: OSRAM SYLVANIA Inc., Danvers, MA (US)

( * ) Notice: Subject to any disclaimer, the term of this patent is extended or adjusted under 35 U.S.C. 154(b) by 154 days.

(21) Appl. No.: 12/315,304

(22) Filed: Dec. 2, 2008

(65) Prior Publication Data

US 2010/0133981 A1 Jun. 3, 2010

(51) Int. Cl.
 *H01J 1/88* (2006.01)
 *H01J 19/42* (2006.01)
 *H01K 1/18* (2006.01)

(52) U.S. Cl. ........ 313/272; 313/115; 313/579; 313/250; 313/271; 313/316; 313/344

(58) Field of Classification Search ................ 313/9, 37, 313/115, 578, 249–250, 252, 256–258, 264, 313/270–279, 315–316, 331–333, 341–345
See application file for complete search history.

(56) References Cited

U.S. PATENT DOCUMENTS

| | | | | | |
|---|---|---|---|---|---|
| 1,975,844 | A | * | 10/1934 | Gustin | 313/9 |
| 2,022,219 | A | * | 11/1935 | Ruben | 315/46 |
| 2,067,129 | A | * | 1/1937 | Marden | 313/629 |
| 2,392,333 | A | * | 1/1946 | Chalmers | 315/48 |
| 3,441,772 | A | * | 4/1969 | Cardwell, Jr. | 313/113 |
| 3,441,776 | A | * | 4/1969 | Cardwell, Jr. | 313/273 |
| 3,445,713 | A | * | 5/1969 | Cardwell, Jr. | 313/273 |
| 3,497,752 | A | * | 2/1970 | Peterson | 313/271 |
| 3,600,053 | A | * | 8/1971 | Smith | 445/27 |
| 3,717,783 | A | * | 2/1973 | Notelteirs et al. | 313/580 |
| 3,743,375 | A | * | 7/1973 | De Fraeye | 445/27 |
| 3,777,207 | A | * | 12/1973 | Notelteirs et al. | 313/578 |
| 4,415,833 | A | * | 11/1983 | Oetken et al. | 313/559 |
| 4,570,104 | A | * | 2/1986 | Janssen et al. | 315/50 |
| 4,658,180 | A | * | 4/1987 | Ooms | 313/273 |
| 4,812,710 | A | * | 3/1989 | Klam et al. | 313/579 |
| 4,841,196 | A | | 6/1989 | Waymouth | |
| 5,146,134 | A | * | 9/1992 | Stadler et al. | 313/579 |

(Continued)

FOREIGN PATENT DOCUMENTS

EP 0 213 495 A2 3/1987

(Continued)

*Primary Examiner* — Nimeshkumar D Patel
*Assistant Examiner* — Jose M Diaz
(74) *Attorney, Agent, or Firm* — Edward S. Podszus

(57) ABSTRACT

A lamp (10), which can be used in rapid thermal processing (RTP), has a lamp envelope (12) arrayed along a longitudinal axis (14) and has a top (16) and a bottom (18). A first coiled-coil filament (20) having a first lead-in (20*a*) and a second coiled-coil filament (22) having a second lead-in (22*a*), are parallelly arrayed to each other and to the longitudinal axis (14) within the envelope (12). A serial connector (24) joins the first and second filaments; and an electrically insulating support (26) is positioned near the bottom (18) of the lamp envelope (12). The first lead-in (20*a*), the second lead-in (22*a*) and at least a portion (24*a*) of the serial connector (24) are sealed within the insulating support 26 whereby the first and second lead-ins (20*a*, 22*a*) and the at least a portion (24*a*) of the serial connector (24) provide the only support for the first and second filaments (20, 22). In a preferred embodiment, the first and second filaments (20, 22) have a wire diameter twice the diameter of a nominal CC6 filament.

2 Claims, 1 Drawing Sheet

U.S. PATENT DOCUMENTS

| | | | |
|---|---|---|---|
| 5,268,613 A * | 12/1993 | Cunningham | 313/113 |
| 5,367,220 A * | 11/1994 | Stadler et al. | 313/578 |
| 5,380,230 A * | 1/1995 | Smith et al. | 445/32 |
| 5,821,678 A * | 10/1998 | Michel | 313/274 |
| RE36,316 E | 9/1999 | Cunningham | |
| 6,583,536 B1 * | 6/2003 | Gibboney, Jr. | 313/115 |
| 6,639,364 B1 * | 10/2003 | Woods et al. | 313/625 |
| 6,947,665 B2 | 9/2005 | Garmer et al. | |
| 7,285,758 B2 | 10/2007 | Johnson | |
| 7,393,797 B2 | 7/2008 | Tsai | |
| D588,288 S * | 3/2009 | Kawagoe et al. | D26/2 |
| D597,688 S * | 8/2009 | Kawagoe et al. | D26/3 |
| 2007/0018574 A1 | 1/2007 | Davies et al. | |

FOREIGN PATENT DOCUMENTS

EP    0 271 859 B1    4/1997

* cited by examiner

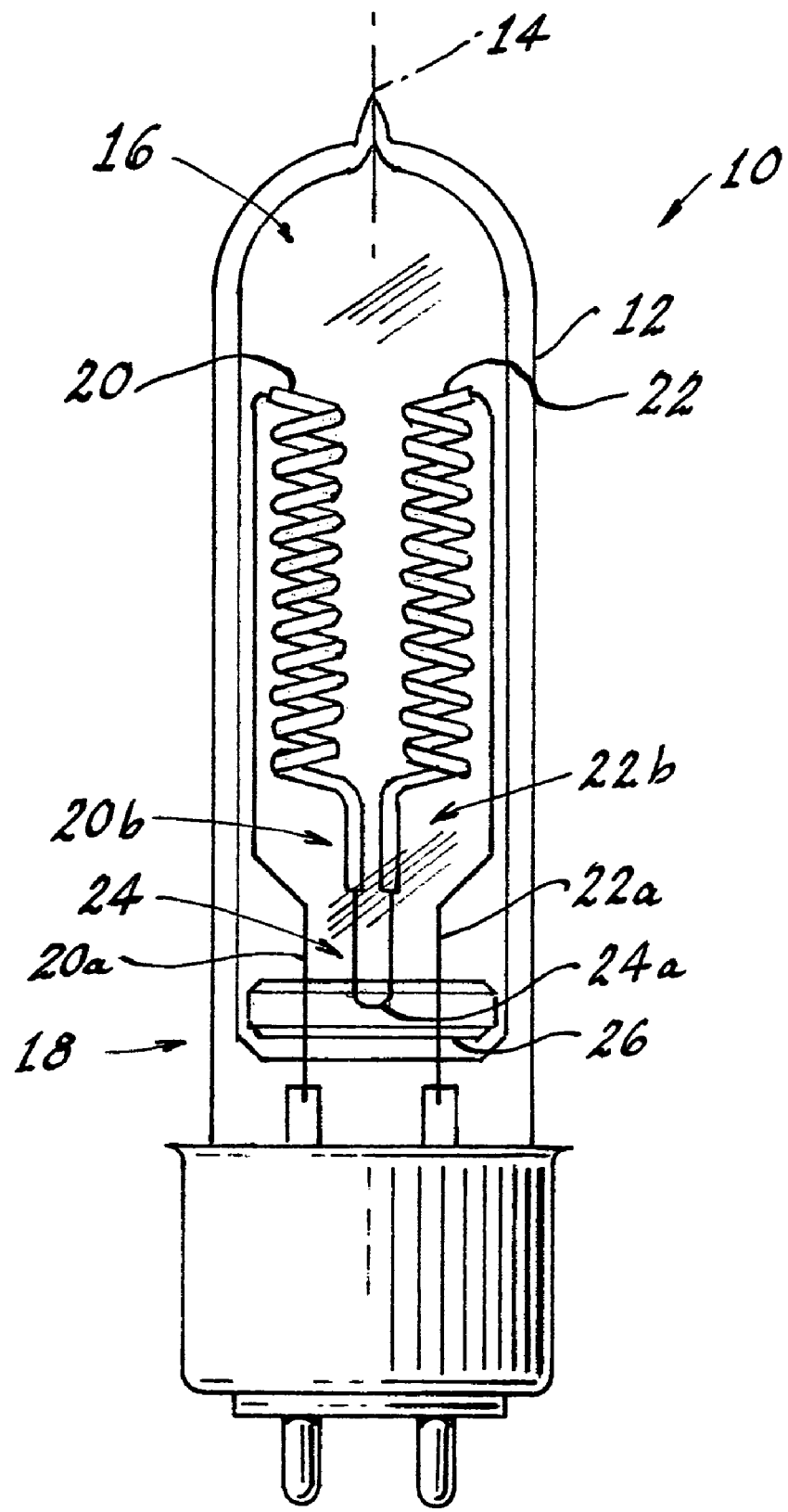

DUAL FILAMENT LAMP FOR RAPID TEMPERATURE PROCESSING

TECHNICAL FIELD

This invention relates to lamps and more particularly to heat lamps for use with Rapid Thermal Processing (RTP).

BACKGROUND ART

Rapid Thermal Processing (RTP) is employed in many industries where heating of a product at some point in time during production is required. One such product, for example, involves semiconductors in semiconductor chip manufacturing. In such processes a heating method (e.g., an optical heating method) is used to ramp up the temperature of a semiconductor wafer rapidly, hold at a steady state high temperature for a period of time, and then ramp down rapidly. RTP allows the wafer to be heated very quickly to its activation temperatures (e.g., at least 1000 degrees C.). The activation temperature is the temperature at which a corresponding processing step (e.g., deposition, implantation, diffusion, removal or formation of key materials) is stabilized. The temperature and the period of time at which that temperature is maintained must be executed precisely for each processing step. Overheating can cause dopants to permeate subjacent layers, and under-heating can produce layers with uncontrolled characteristics.

RTP in semiconductor processing has been used for annealing of semiconductor wafers. One such application of RTP is to anneal the wafer after ion implantation. The RTP heaters used for these purposes must have a high uniformity; that is, the temperature must be uniform across the entire wafer surface. In most known RTP heaters, the solid angle of the filament—which is the solid angle subtended by the filament when viewed from the wafer surface—is extremely small, on the order of a tenth of a radian. The view factor area then is defined as the area projected on the wafer by the solid angle of the filament (i.e., the solid angle of the filament multiplied by the distance between the filament and the wafer). When the total solid angle for the total wafer coverage is 4.pi. radians, a solid angle of a tenth of a radian covers only about 1% of the wafer. Reflectors outside a container wall of quartz only extend the radiation field for the short wavelength radiation field.

Known RTP heaters have a relatively short lifetime because those lamps have a physical connection between their filaments and their power supplies. Such lamps are sealed on the ends, and the wires connecting the filaments are brought to the outside world to be physically connected to a power supply. This physical connection causes a high failure rate due to the filament input/output connection failure, which in turn is due to the stresses built up at the interface as a result of the different thermal expansion rates of the metals in the connection, during normal lamp operation. Known tungsten halogen lamps for use with such systems have used a relatively thin single filament to generate the necessary heat. For example, one such lamp used for many years is a 1000 watt, 240 volt tungsten halogen lamp with a rated life of 150 hours. The lamp has an output of 23,000 lumens with a color temperature of 3200K and a maximum bulb temperature of 900° C.

It would be an advance in the art if the power output and life of such lamp could be increased while reducing the complexity of the lamp and maintaining or lowering the cost.

DISCLOSURE OF INVENTION

It is, therefore, an object of the invention to obviate the disadvantages of the prior art.

It is another object of the invention to enhance the operation of lamps used in RTP.

It is yet another object of the invention to improve the performance of tungsten halogen lamps.

These objects are accomplished, in one aspect of the invention, by a lamp for use in rapid thermal processing comprising: a lamp envelope arrayed along a longitudinal axis and having a top and a bottom; a first coiled-coil filament having a first lead-in and a second coiled-coil filament having a second lead-in parallelly arrayed to each other and to the longitudinal axis within the envelope; a serial connector joins the first and second filaments at ends remote from the lead-ins; and an electrically insulating support is positioned near the bottom of the lamp envelope, the first lead-in, said second lead-in and at least a portion of the serial connector are sealed within the insulating support whereby the first and second lead-ins and the at least a portion of the serial connector provide the only support for the first and second filaments.

Surprisingly, when operated at the same parameters as the single coil lamp, (i.e., 1000 watts and 240 volts) the twin filament lamp (whose filaments have twice the thickness of a single filament CC6, but with the same mass) has a rated life of 250 hours and a lumen output of 27,500 lumens. Gaining lumens and life is totally unexpected since usually any increase in one of these values dictates a decrease in the other.

BRIEF DESCRIPTION OF THE DRAWINGS

The single FIGURE illustrates an embodiment of the invention.

BEST MODE FOR CARRYING OUT THE INVENTION

For a better understanding of the present invention, together with other and further objects, advantages and capabilities thereof, reference is made to the following disclosure and appended claims taken in conjunction with the above-described drawings.

Referring now to the drawing with greater particularity, there is shown in the FIGURE a lamp 10, for example, a tungsten halogen lamp that, among other uses, can be employed for use in rapid thermal processing. The lamp 10 has an envelope 12 arrayed along a longitudinal axis 14 and has a top 16 and a bottom 18. Positioned within the envelope 12 is a first coiled-coil filament 20 having a first lead-in 20a and a second coiled-coil filament 22 having a second lead-in 22a, the first and second coils being parallelly arrayed to each other and to the longitudinal axis 14 within the envelope 12. In a preferred embodiment of the invention the first and second filaments 20, 22 have a wire diameter twice the diameter of a nominal CC6 filament but substantially equal mass to that of the single filament. The greater diameter translates into higher mechanical stability and contributes to the increase in life.

A serial connector 24, which can be a separate entity joined to the coils or an integral extension of the coils themselves, joins the first and second filaments 20, 22 at the ends 20b, 22b remote from the lead-ins 20a, 22a. An electrically insulating support 26 of a suitable material, for example glass or quartz, is positioned near the bottom 18 of the lamp envelope 12, and the first lead-in 20a, the second lead-in 22a and at least a portion 24a of the serial connector 24 are sealed within the insulating support 26, whereby the first and second lead-ins 20a, 22a and the at least a portion 24a of the serial connector 24 provide the only support for the first and second filaments 20, 22. This system eliminates several isolated support pins previously needed to support the filament and decreases both the cost of materials and the complexity of making the lamp.

The lamp 10 with the twin filaments of double the wire diameter of the previously used single filament provided the lamp with a lumen output 26% greater than the equivalent single filament lamp and a life expectancy 64% greater than the equivalent single filament lamp. As previously noted a lamp with both increased life and lumen output is extremely unusual since these two conditions are generally considered to be mutually exclusive.

While there have been shown and described what are at present considered to be the preferred embodiments of the invention, it will be apparent to those skilled in the art that various changes and modifications can be made herein without departing from the scope of the invention as defined by the appended claims.

What is claimed is:

1. A lamp for use in rapid thermal processing comprising: a lamp envelope arrayed along a longitudinal axis and having a top and a bottom; a first coiled-coil filament having a first lead-in and a second coiled-coil filament having a second lead-in parallelly arrayed to each other and to said longitudinal axis within said envelope; a serial connector joining said first and second filaments at ends remote from said lead-ins, said serial connector having a first end, a second end, and an intermediate portion between the first and second ends, wherein the first end, the intermediate portion, and the second end together define a sequential electrically conductive pathway between the first coiled-coil filament and the second coiled-coil filament; and an electrically insulating support positioned near said bottom of said lamp envelope, said first lead-in, said second lead-in and at least a portion of said serial connector being sealed within said insulating support whereby said first and second lead-ins and said at least a portion of said serial connector provide the only support for said first and second filaments; and a portion of said electrical pathway containing the intermediate portion is sealed in and extends through the insulating support, whereby a path for conduction of electricity is defined along said electrical pathway through said insulating support.

2. A method of operating a rapid thermal processing lamp, comprising providing a lamp envelope arrayed along a longitudinal axis and having a top and a bottom;

providing a first coiled-coil filament having a first lead-in and a second coiled-coil filament having a second lead-in arrayed generally along said longitudinal axis within said envelope;

providing a serial connector joining said first and second filaments at ends remote from said lead-ins, said serial connector having a first end, a second end, and an intermediate portion between the first and second ends, defining a collective sequential electrically conductive pathway between the first and second coiled-coil filaments extending from the first end through the intermediate portion and to the second end;

providing an electrically insulating support positioned near said bottom of said lamp envelope, sealing said first lead-in, said second lead-in and at least a portion of said serial connector containing at least a portion of the intermediate portion within said insulating support;

supporting said first and second filaments solely by said first and second lead-ins and said at least a portion of said serial connector;

applying a voltage between the first and second lead-ins to operate the lamp; and, conducting, during the applying, electricity via the intermediate portion in a region internal to and through said insulating support.

* * * * *